(12) United States Patent
Hamlin

(10) Patent No.: US 6,779,168 B2
(45) Date of Patent: *Aug. 17, 2004

(54) MAGNETORESISTIVE MEMORY FOR A COMPLEX PROGRAMMABLE LOGIC DEVICE

(75) Inventor: Christopher L. Hamlin, Los Gatos, CA (US)

(73) Assignee: LSI Logic Corporation, Milpitas, CA (US)

(*) Notice: Subject to any disclaimer, the term of this patent is extended or adjusted under 35 U.S.C. 154(b) by 254 days.

This patent is subject to a terminal disclaimer.

(21) Appl. No.: 10/061,660

(22) Filed: Feb. 1, 2002

(65) Prior Publication Data
US 2003/0149833 A1 Aug. 7, 2003

(51) Int. Cl.[7] .............................................. G06F 17/50
(52) U.S. Cl. .............................. 716/16; 326/40; 326/41; 716/17; 716/18

(58) Field of Search ........................ 326/40, 41, 101; 716/16, 17, 18

(56) References Cited

U.S. PATENT DOCUMENTS 6,605,962 B2 * 8/2003 Lee et al. ..................... 326/41
6,640,333 B2 * 10/2003 Hamlin ........................ 716/16
6,643,195 B2 * 11/2003 Eldredge et al. ............ 365/200

* cited by examiner

Primary Examiner—Daniel D. Chang
(74) Attorney, Agent, or Firm—Suiter•West PC LLO

(57) ABSTRACT

The present invention is directed to magnetoresistive memory and data storage devices. A system for providing distributed functionality in an electronic environment includes a plurality of platforms suitable for providing a logic function. The platforms include embedded programmable logic, and MRAM memory, the logic and MRAM memory communicatively coupled via an interconnect.

7 Claims, 4 Drawing Sheets

MAGNETORESISTIVE MEMORY FOR A COMPLEX PROGRAMMABLE LOGIC DEVICE

CROSS REFERENCE TO RELATED APPLICATIONS

The present application hereby incorporates the following United Stated States Patent Applications by reference in their entirety:

| Attorney Docket Number | Ser. No. | Filing Date |
| --- | --- | --- |
| LSI 01-390 | 10/015,194 | Nov. 20, 2001 |
| LSI 01-488 | 10/021,414 | Oct. 30, 2001 |
| LSI 01-489 | 10/021,619 | Oct. 30, 2001 |
| LSI 01-490 | 10/021,696 | Oct. 30, 2001 |
| LSI 01-524 | 10/034,838 | Dec. 27, 2001 |
| LSI 00-695 | 09/842,335 | Apr. 25, 2001 |
| LSI 01-827 | 10/034,839 | Dec. 27, 2001 |

FIELD OF THE INVENTION

The present invention generally relates to the field of semiconductors and semiconductor design, and particularly to an architecture for a configurable platform including magnetoresistive memory.

BACKGROUND OF THE INVENTION

Integrated circuits have become a necessary part of everyday modern society. From wireless phones and information handling systems, to household appliances and data storage systems, a wide range of integrated circuits are utilized to provide a broad range of functionality. To provide this functionality, integrated circuits may need to be specialized to have the functions necessary to achieve the desired results, such as through the provision of an application specific integrated circuit (ASIC). An ASIC is typically optimized for a given function set, thereby enabling the circuit to perform the functions in an optimized manner. However, there may be a wide variety of end-users desiring such targeted functionality, with each user desiring different functionality for different uses.

Additionally, more and more functions are being included within each integrated circuit. While providing a semiconductor device that includes a greater range of functions supported by the device, inclusion of this range further complicates the design and increases the complexity of the manufacturing process. Further, such targeted functionality may render the device suitable for a narrow range of consumers, thereby at least partially removing an "economy of scale" effect that may be realized by selling greater quantities of the device.

Thus, the application specific integrated circuit business is confronted by the contradiction that the costs of design and manufacture dictate high volumes of complex designs. Because of this, the number of companies fielding such custom designs is dwindling in the face of those rapidly escalating costs.

Further, there are limited options, previously, for storing state information on a platform device. In order to give the platform device state, a platform utilizes memory that may be written to and read from to configure a platform or groups of platforms.

Therefore, it would be desirable to provide a platform architecture of the present invention.

SUMMARY OF THE INVENTION

Accordingly, the present invention is directed to an architecture. In a first aspect of the present invention, a system for providing distributed functionality in an electronic environment includes a plurality of platforms suitable for providing a logic function. The platforms include embedded programmable logic and MRAM memory, the logic and MRAM memory communicatively coupled via an interconnect.

In a second aspect of the present invention, a data storage system includes an electronic data storage device suitable for the storage of electronic data, an MRAM memory operable for the storage of electronic data utilizing a magnetoresistive effect and a controller communicatively coupled to the data storage device and the MRAM memory. The controller is suitable for controlling operations of the data storage device, wherein the controller receives data for writing to the electronic data storage device, the data is stored utilizing the MRAM memory before writing to the electronic data storage device.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 4, exemplary embodiments of the present invention are shown. The present invention provides an architecture for an element for use as a design component in application specific integrated circuit (ASIC) or semiconductor design. Technical questions involving complex device design may be thought of in two general areas, metamethodology and platform architecture. Metamethodology is a formal organizing architecture for defining and managing arbitrary semiconductor design flows in predictable, efficient ways, which may be tailored to specific product and process characteristics. For instance, different flows may have different combinations of tools in them, and thus, the successful operations may require the imposition of automated rule-based assessment of progress and error in order to allow designers to work productively at a higher level of abstraction than is available today.

As semiconductor designs progress along the deep submicron roadmap, and as the challenge of managing complexity becomes ever greater, the need to define building blocks of designs at higher levels of abstraction becomes even more pressing. Such a higher-level building block includes a "platform."

Figure 1:
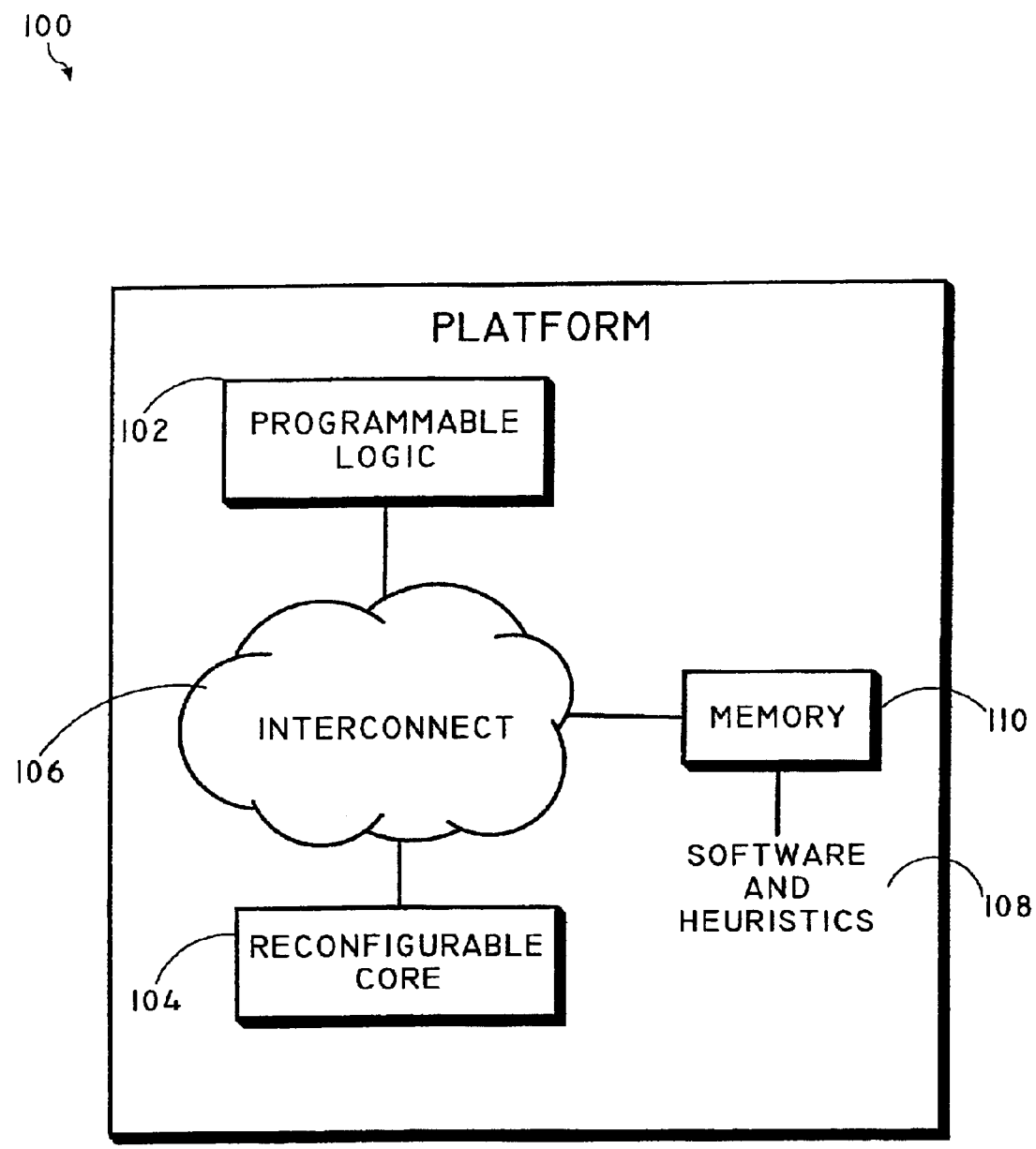
FIG. 1 is an illustration of an embodiment of the present invention wherein a platform operable to embodiment embody the present invention is shown.

Referring now to FIG. 1, an embodiment 100 of the present invention is shown wherein elements of an exemplary platform are provided. A platform may include a combination of the following elements: (1) embedded programmable logic 102, which in some contemplated embodiments is analogous to field programmable gate array (FPGA) or complex programmable logic device (CPLD) cores that FPGA companies sell as complete devices; (2) reconfigurable cores 104 such as a fundamental processor elements to which may be added instruction-specialized, application-specific instruction set extensions; (3) an advanced interconnect 106, which in contemplated embodiments is scalable, and may be isochronous; (4) software models and heuristics 108; and (5) specialized memories 110, which may include nonvolatile structures like MRAM, which is a memory that is based on the magneto-resistive effect, as well as other memories as contemplated by a person of ordinary skill in the art. Specialized one-time programmable flash memory may also be included.

Programmable logic 102 components may include blocks of programmable gate arrays, "seas of adders", CPLD structures, and other suitable programmable circuit elements definable from a stored representation, either at power-on, dynamically while in operation, and the like.

Reconfigurable cores 104 may include a base processor design, plus instruction set extensions designed to carry out function-specific logical and arithmetic operations with optimal efficiency. For instance, such reconfigurable cores may implement digital signal processing instruction set enhancements.

An interconnect 106 architecture is provided to allow the programmable logic and the reconfigurable cores to communicate with one another and with associated memory blocks. Such an architecture may define a transport which is scalable in bandwidth and is inherently isochronous. Further, it may be realizable within a switching fabric, which permits complex, adaptive, interconnect and access paths to be defined on the fly. Isochrony, through a universal time base, may simplify the problems of closing timing in complex designs.

The software for the platform may include the development environment and its interface to the metamethodology, as well as software IP cores, which may be implemented on the platform components, and the customer-developed custom code implementing proprietary or functionally specific routines.

There are numerous ways of structuring logic blocks: such as the number of logic elements in an organization; the kinds of cores and the numbers of cores; whether or not DSP-specific characteristics are included, and the like. Additionally, the characteristics of the interconnect, software, and memory may all be varied in innumerable different ways without departing from the spirit and scope of the present invention.

The present invention provides a platform, which may be embedded in a methodological framework that allows designers to work with the platform at a high level of abstraction. The complexity of the interactions between elements may so great that by providing abstractions, the interactions may be rendered manageable and tractable for designers that will use them practically.

Figure 2:
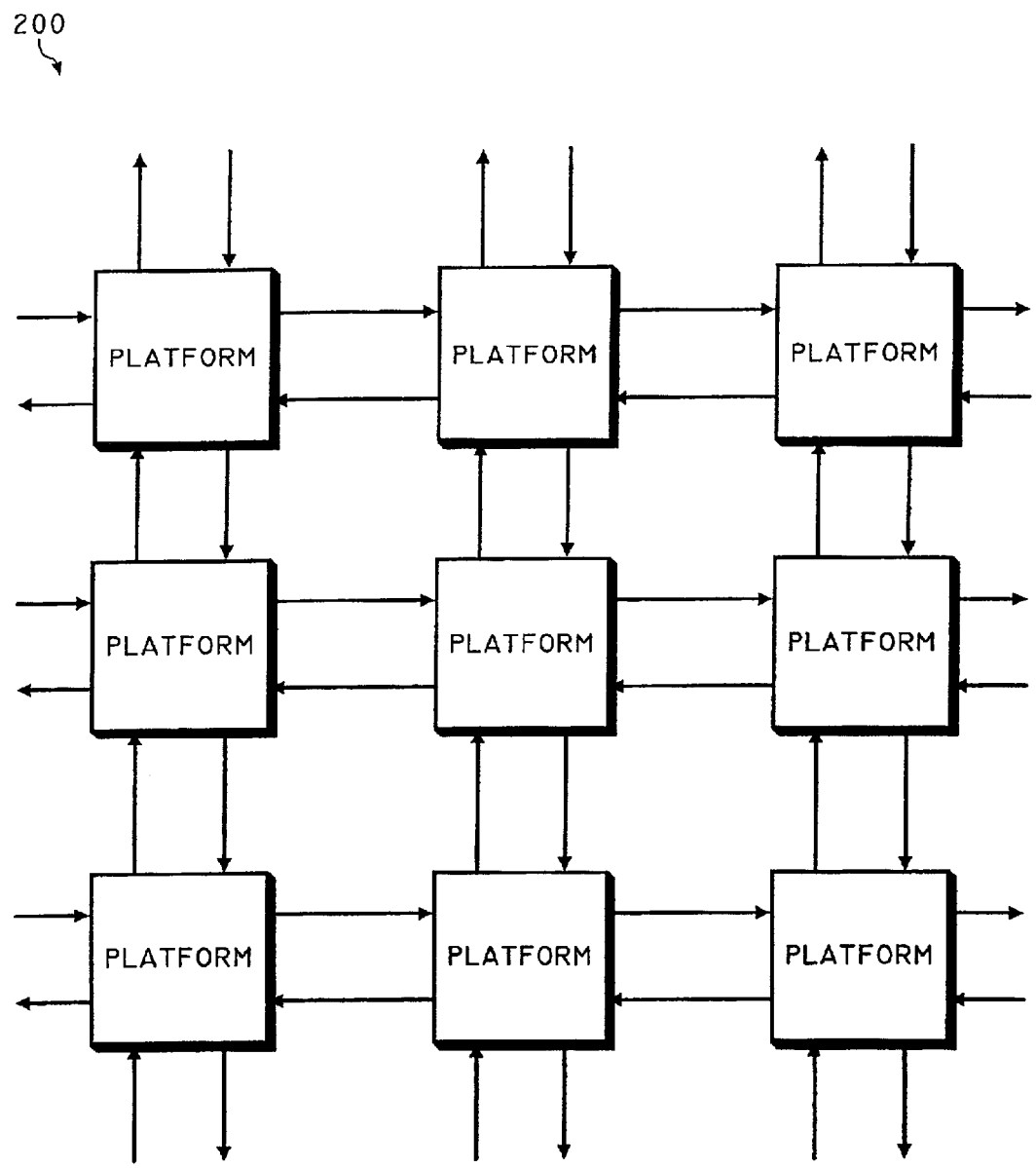
FIG. 2 is an illustration of an embodiment of the present invention wherein a plurality of platforms as shown in FIG. 1 are provided in a fabric.

Referring now to FIG. 2, an embodiment 200 of the present invention is shown wherein an architecture is configured as a sea of platforms. In this embodiment, a fabric is shown including a plurality of platforms. Preferably, the platforms are connected utilizing similar protocols, interconnect technology and interconnect architecture to unify the platforms in a single fabric.

Thus, a structure of the resources may be provided including the memory, reconfigurable cores, embedded programmable blocks, software and interconnect, which communicates and intercommunicates coherently on an isochronous fabric. Such a structure may be suitable for providing a "programmable ASIC". For instance, an application-neutral device may be constructed with potential for accepting complex logic and definitions that are programmed completely independently of the fabrication of the device. This may be thought of as a decoupled model, in which the contemplated implementation of the device as used by an end-user is decoupled from the process of designing and manufacturing the physical device itself.

Each of these intersections on this fabric, may contain one or more processors, embedded programmable logic, memory, software capabilities and its own interconnect internally, as described in relation to FIG. 1. By providing this fabric including reconfigurable cores, the present invention may provide a targeted semiconductor providing desired functionality without requiring specialized design and manufacturing processes as previously required in ASIC manufacture.

For example, a manufacturer may receive a register transfer level (RTL) definition of a solution to a problem from a customer for a specification. A customer may want to create, for instance, a communications device, a storage device, a controller, a switching product, a game controller for consumer application, a satellite TV set-up box, and the like, and supply an RTL specification for the desired device to the manufacturer.

By utilizing the present invention, the RTL may be mapped into the platform of the present invention to provide the desired functionality as indicated by the RTL. For instance, instruction set architecture extensions may be utilized for mapping to the reconfigurable core the desired functionality. The extensions may be crafted to solve efficiently and specifically problems in encryption, in encoding or decoding, in modulation, in signal processing, in data transformation of various kinds, and the like. Additionally, abstract logic functions may be implemented, such as specialized shift registers, multiplexers (MUX), and the like as contemplated by a person of ordinary skill in the art. Thus, an instruction set extension may be affiliated with a wide range of functionality.

An embedded programmable logic core (EPLC) block may be tied to a set of instruction set extensions such that the EPLC block would have responsibility under software control for invoking any of several extensions to be active in a particular temporal episode. In this way, the "personality" of a reconfigurable core may be changed dynamically under the control of this EPLC mechanism. Thus, in an aspect of the present invention, this may enable the mapping of an RTL efficiently into a sea of platforms. The constituents of one platform may allow an EPLC block to play a role when choosing appropriate instruction set extensions as needed, given the temporal evolution of the function that the block is fulfilling.

Isochronous Functionality

Referring again to FIG. 2, by providing an isochronous fabric, the register files of multiple processors in multiple platforms may be utilized as dynamically extensible. In other words, it is possible because of the isochronous characteristic of the fabric, without additional software or additional overhead, to synchronize and coordinate the instruction-set extension operations on these register files over as many platforms as needed, which may be thought of as extending horizontally across the fabric as desired to achieve the necessary resources, such as processor power and the like, to fulfill a particular complex logic function.

Arbitrary sets of logic functions may be deployed across register files, and the instruction set extensions treated as general logic engines that are reconfigurable "on-the-fly," on a cycle-by-cycle basis. For instance, given, (a), the provision of a proper instruction set extension or extensions to coordinate discrete, distinctive, different instruction set extensions on a cycle-by-cycle basis; and (b), that the execution is synchronized, for instance, to ensure that the right instruction set extension is invoked in the right set of reconfigurable cores at the right cycle, the functions may be deployed across platforms, operating as logic engines, as needed. Thus, by knowing the functionality of a register, where that functionality is located, and the function of a register at a given point in time, logic functions may be targeted to provide the functionality.

For example, in terms of actual behavior of applications in the real world, loads vary, and functions vary as loads vary. By utilizing the present invention, spatial distribution of functions across the array may vary as a function of the dynamic changes in the functional load that is actually being asked of a particular device.

To track these changes and provide the functionality, a map may be maintained indicating the functionality of the platforms. For instance, in an aspect of the present invention, a master map is maintained of the instantaneous distribution of functions across the platforms. Such a map may be thought of as a functional virtualization, in which the map indicating corresponding functions and locations is fully virtualized. Thus, functional virtualization may be provided in addition to a general logic capability previously discussed.

Because the isochronous foundation of this embodiment of the present invention, the isochronous fabric provides coordinated synchronization without the bookkeeping or overhead which may be associated utilizing other methods. By providing a mapping of particular components, i.e. what the particular components are set up to do what particular component of a function at what point in time, desired functionality may be achieved in a coordinated fashion.

Compiler

In an additional aspect of the present invention, a smart compiler is provided which "understands" how to manage and develop a binary executable for a particular instruction set extension. Further, the compiler technology may be generalized so that it has the property of extending this understanding, so that it may track which extensions are mapped to which particular set of processors, and understands temporally the load value, i.e. the cycle by cycle availability of a resource of a particular kind.

In effect, the compiler technology extends horizontally across processor function sets, so that the compiler, when an application, methodology and like program of instructions is expressed and translated to the compiler, the compiler may determine availability of the resources. Additionally, through the use of an isochronous fabric, there is no overhead associated with altering the connections. Reconfiguring the functionality of a device employing the platforms may be accomplished through changing the map.

The compiler technology of the present invention may implement this space/time view through an arbitrarily extensible very large instruction word (VLIW) architecture that is variable. For example, although the architecture has been used in multimedia engines, the width is cycle-by-cycle variable according to this aspect of the present invention.

The advantages of such a "smart" compiler are numerous. For instance, in cache management, a variety of considerations may be accounted for, such as latency and the resultant performance penalty, associated overhead of flushing the cache versus maintaining a function in place, and the like. Thus, a compiler of the present invention may optimize operations performed by the platforms.

Therefore, in an embodiment of the present invention, a compiler is provided that is capable of maintaining space/time mapping of the instruction set extensions over an isochronous fabric so that cycle-by-cycle ability is maintained to affiliate objects and communicatively couple them as desired.

Mapping

To coordinate and provide desired functionality, a map of the present invention is provided. For instance, in an aspect of the present invention, RTL is expressed, in terms of combinations of instruction set architecture extensions and embedded programmable logic core (EPLC) blocks.

For example, in an aspect of the present invention, a map is provided for describing functions of platforms of the present invention expressed in a graph-theoretic manner. A map may be provided as a graph, for instance, employing graph coloring and with efficient graph-traversal algorithms to describe the interaction and functionality of the components.

Formalisms may be employed for expressing functions, such as MUXs, latches, codecs, and like logic functions and re-expressing the functions in terms of efficient instruction set architecture (ISA) extensions. Preferably, the extensions take into account that some components of the ISA may be modified on a cycle-by-cycle basis on the one hand and may be varied in width on the other hand.

For instance, standard library functions, such as concrete, practical, standard functions in an ASIC, may be expressed as mathematical abstracts. These mathematical abstracts may be expressed as instruction set extensions and EPLC adjuncts that will allow these instructions to be manipulated rapidly. In one contemplated embodiment, ASIC library functions are implemented with minimal overhead penalties and space penalties.

In this way, the present invention provides two degrees of freedom in finding optimal expressions of logic functions that can be deployed across the sea of platforms of the present invention.

Magnetoresistive Memory for A Complex Programmable Logic Device

The present invention may also include nonvolatile memories embedded in platforms. Traditionally, there were limited options for storing state information on a platform device, such as a device including a microcontroller, a reconfigurable core, a DSP, embedded programmable logic, and the like, which is communicatively coupled via a scalable interconnect. In order to give the platform device state, the platform needs some kind of memory that may be written to and read from to configure a chip. The state may be defined at manufacturing time, in the field, such as sending the chip out into the field, and then configuring the chip once it arrives, so that the state may be contextual, and the like as contemplated by a person of ordinary skill in the art.

In addition to defining state, it is also desirable that the platform support repair functionality. For example, in an instance of chip malfunction, a method of introducing a bug fix may be implemented, a self-healing mechanism employed that will allow the chip to reconfigure itself based on a previous definition, redefine the configuration of the chip based on changing needs, and the like. For instance, a new protocol standard may be encountered, and thus the chip may need to be updated with the new standard in the field.

Traditionally, one way of providing this platform support has been to include flash memories within a device. Flash memory is a form of writable nonvolatile memory that may be upgraded in the field. However, flash memory has several disadvantages. Flash memory is asymmetric and requires wear leveling.

For example, flash cells may wear from repeated writings. Therefore, although flash memory may be read repetitively with no harm, a memory location of flash memory may not be written a great multitude of times. There is a wear phenomenon in which voltage required to successfully write to a location gradually increases over time, and as soon as the voltage required to perform a write passes a certain threshold, the device is no longer reliably writable at that location. Thus, the pattern of writes is distributed in a random fashion, i.e. wear leveling, to reduce hot spots that become unwritable. Flash memory is also slow, expensive and is complicated to embed in an ASIC process, and thus, has severe limitations.

Thus, the provision of a reliable memory device may have a significant impact on platform architecture. For example, by providing a reliable memory, platform structures may have the ability to reliably retain state even in the absence of power, which alters how designing a platform and getting the platform to function is approached, because of the ability to have a complex instantaneously recorded state that is preserved through random power interruptions.

By not having these advantages, a variety of considerations must be addressed. For instance, a platform may be provided that has a simpler functionality because the functionality has to be 100 percent defined in the silicon, or the platform must have a secure way of returning to its desired configuration due to malfunction or other functionality interruption, the platform has to be constructed as a "perfect" device because the platform does not have the ability to fix itself, and other considerations as contemplated by a person of ordinary skill in the art. All of those constraints are lifted if a writable nonvolatile memory of the present invention is provided.

Additionally, it is expected that the proportion of a die consumed by memory will continue to increase. In other words, memory is going to occupy more and more of the die area and which is true whether utilizing a sea of platforms architecture or the more traditional processor and IP cores organization is utilized. This argues in favor of the emergence of a nonvolatile form that may retain its content even though the content may become quite large, such as multiple megabytes of data.

Therefore, the present invention provides MRAM for support of the desired functionality. MRAM is a way of applying the magnetoresitive effect, including giant magnetoresistive effect and the like. MRAM includes a set of characteristics that may have the effect of changing how platform architectures are conceived and put together, because MRAM may supply large, symmetrical, cheap, long-lasting nonvolatile memory. Symmetrical and asymmetrical may refer to reading and writing, as well as access time and energy.

GMR technology, such as the technology used in heads of disk drives, exploits a tunneling phenomenon in quantum electronics. Although there is some debate about the theoretical underpinnings of GMR, from a pragmatic point of view, it is a well understood issue.

The inclusion of MRAM in a platform of the present invention may provide a wide range of desired behaviors. For example, if a memory block included in a platform is all or largely MRAM, a variety of beneficial behaviors may be provided; very large memory areas may be provided; a plurality of megabytes may be written arbitrarily; the memory is reliable; the content is symmetrical (in other words, the amount of energy required to write is essentially equivalent to the amount of energy required to read, which is not true with flash); and the like. These behaviors allow definition of a state of high complexity that may be completely independent in the device itself and may be interrogated and updated remotely with little or no risk. Because flash is slow to write, requires wear leveling and has a finite lifetime, state information may not be updated in the device in the nonvolatile memory space utilizing flash memory a multitude of times, and thus, requires the additional considerations previously described to be addressed.

The use of MRAM may have a profound impact on how platforms are structured in the future. The MRAM approach provides the capability of accommodating a vastly greater range of states in a platform device's state space which may be reliably and dependably updated and interrogated. Secure encryption may also be utilized so the content may be nonvolatile but still secure and interrogatable only from a remote trusted authority.

This functionality changes platform character because now the control codes that define the state of the platform, (such as a sea of platforms, which may be an immensely complex system environment) may be written into a symmetrical low-cost, high-density writable nonvolatile memory that may be upgraded and interrogated at will. The state memory may be updated rapidly and securely in order to make sure that the device stays on-line.

Figure 3:
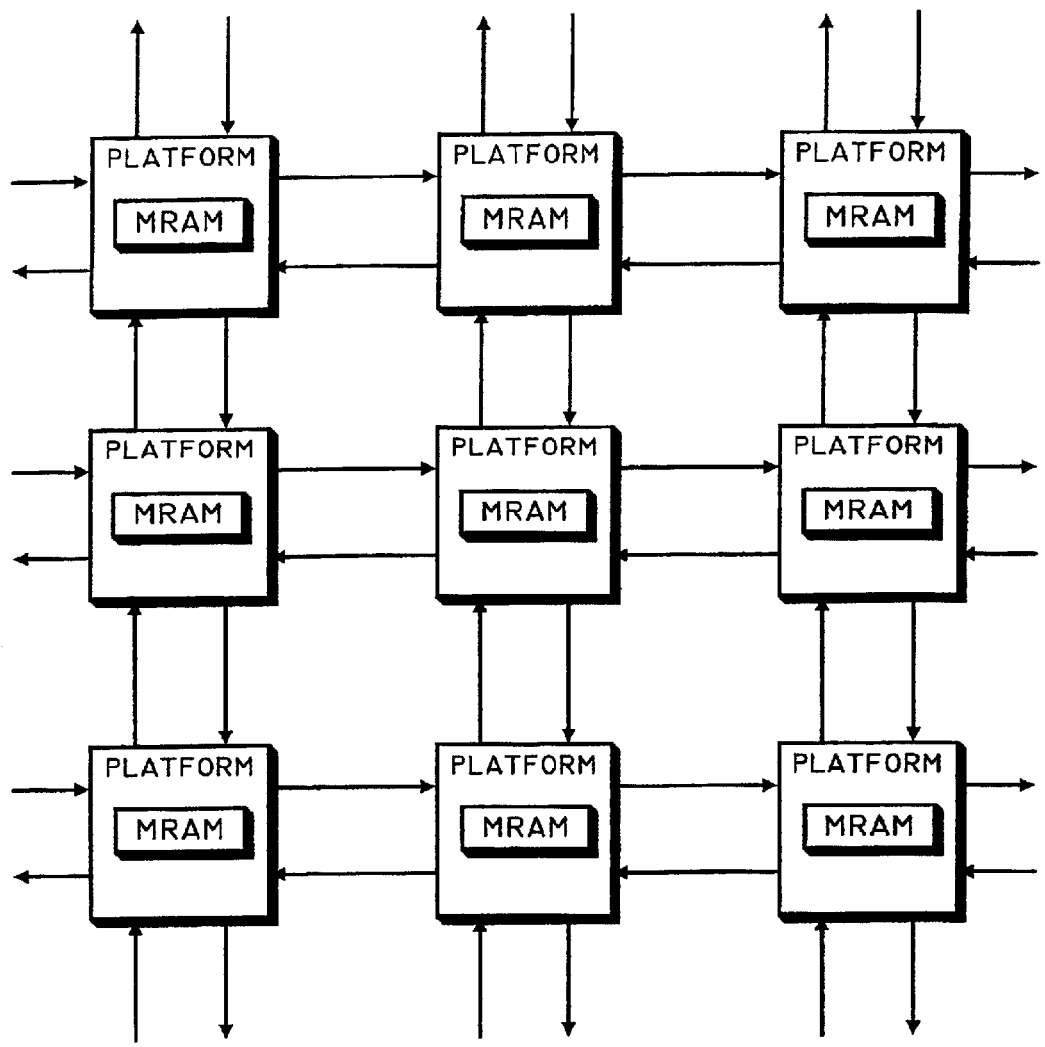
FIG. 3 is an illustration of an embodiment of the present invention wherein a plurality of platforms incorporating MRAM in a sea of platforms architecture is shown.

For example, referring now to the embodiment shown in FIG. 3, a sea of platforms architecture may be provided in which each of the platforms has a corresponding MRAM for storage of state information. By including state information within the platforms themselves, the state information may be accessible even in the case of power failure, and may be written and accessed a multitude of times without the problems of wear-leveling as required in utilizing flash memory. Although MRAM is shown within each platform, MRAM may be distributed through the "sea of platforms" utilizing a variety of methods without departing from the spirit and scope thereof, such as in platform groupings and the like.

The use of MRAM may also result in increased yields due to the repair capability. For instance, repair capabilities may include complex repair algorithms, redundant resources on the device that may be invoked remotely when malfunction of the device is detected, and the like. Thus, the ability to repair a platform including this architecture may decrease production costs, improve device operability and increase performance of the platform incorporating this functionality.

Genetic programming may also be greatly improved, such as in instances in which a chip computes among a multitude of possibilities, MRAM provides the memory characteristics needed to facilitate this access. For instance, where the patterns of access are heavily concentrated in a very small number of locations for intense periods of time, flash is ill-suited for computationally intensive environments where writes need to be performed into the nonvolatile space. Additionally, many algorithms either require such access or are heavily optimized on the assumption of the ability to write into a nonvolatile space repetitively and intensively.

Further, this nonvolatile, as opposed to volatile, memory may have improved power consumption, power management functionality, as well as support disaster recovery as described previously.

Figure 4:
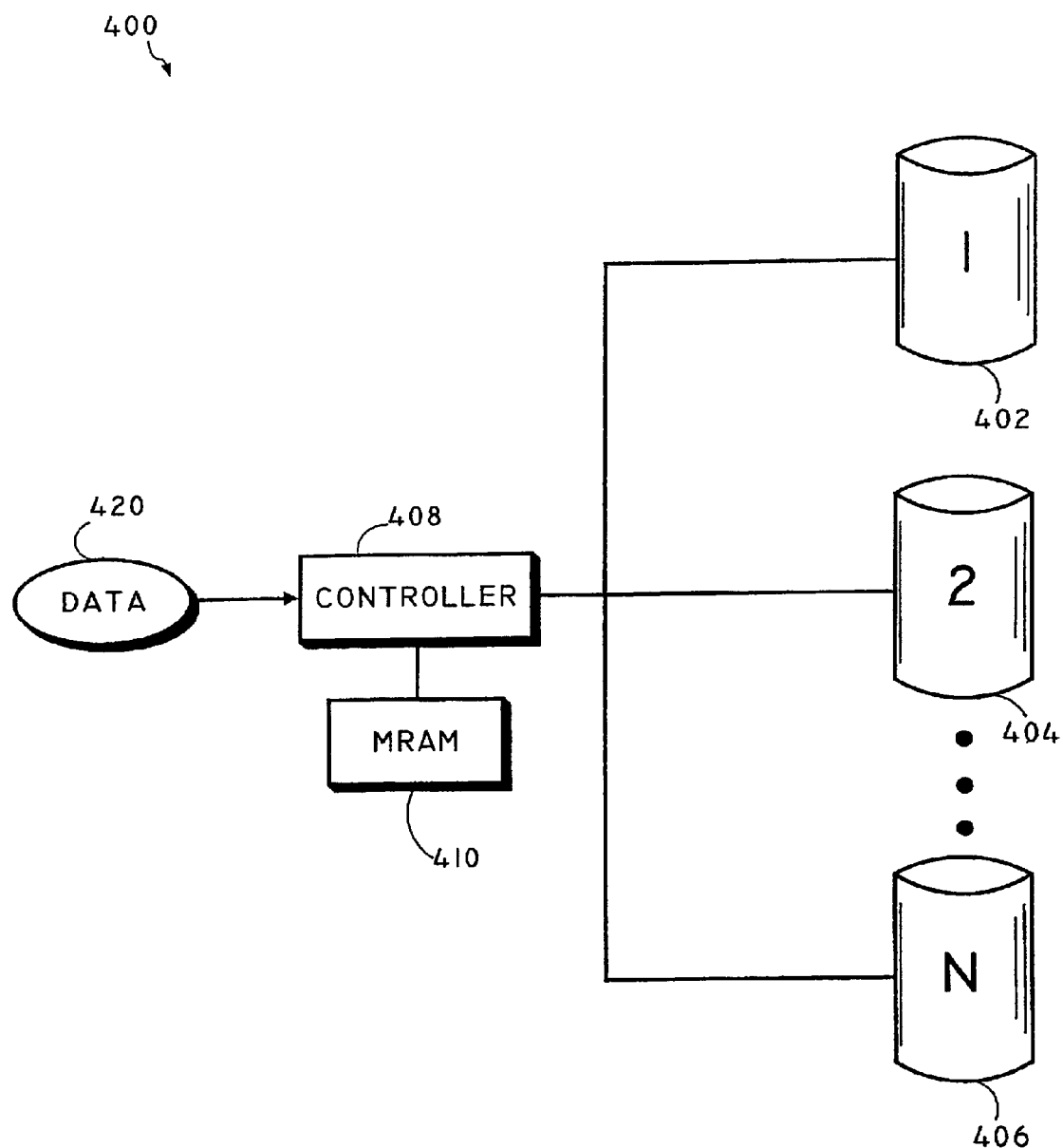
FIG. 4 is an illustration of an electronic data storage system including MRAM.

In another embodiment of the present invention shown in FIG. 4, MRAM is incorporated into a data storage system. For instance, the control of large repositories, such as a RAID array including multiple data storage devices 402, 404 & 406, disk farms and the like, may be provided in which a write operation needs to be performed for storage of data. However, the disk may have high latency, delayed operation in the instance of a swappable disk, and the like.

To provide reliable data storage, an area of nonvolatile memory, in this case MRAM 410, is provided so that in the case of power failure, device malfunction, and the like, that state information is captured even before it has been committed to the very high-latency medium that is represented by a disk drive and the like. For example, the MRAM repository 410 may be accessible by a controller 408 of a RAID array, in which data is first received by the controller and written to the MRAM 410 before being transferred to the data storage devices 402, 404 & 406. Thus, the design of controllers 408 for large repositories will be heavily affected by the availability of these symmetrical nonvolatile memories.

It is believed that the architecture of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A system for providing distributed dynamic functionality in an electronic environment comprising:
   a plurality of platforms, the platforms suitable for providing a logic function, the platforms including embedded programmable ionic and MRAM memory, the logic and MRAM memory communicatively coupled via an interconnect; and
   a map expressing logic function of the plurality of platforms,
   wherein the map includes instruction set architecture extensions and embedded programmable logic core adjuncts.

2. A system for providing distributed dynamic functionality in an electronic environment comprising:
   a plurality of platforms, the platforms suitable for providing a logic function, the platforms including embedded programmable logic and MRAM memory, the logic and MRAM memory communicatively coupled via an interconnect; and
   a map expressing logic function of the plurality of platforms,
   wherein the map describes logic functions as provided by the plurality of platforms on a cycle-by-cycle basis.

3. A system for providing distributed dynamic functionality in an electronic environment comprising:
   a plurality of platforms, the platforms suitable for providing a logic function, the platforms including embedded programmable logic and MRAM memory, the logic and MRAM memory communicatively coupled via an interconnect; and
   a map expressing logic function of the plurality of platforms,
   wherein the map describes logic functions as provided by the plurality of platforms in a manner so as to express groupings of platforms of the plurality of platforms utilized to perform the logic function.

4. A system for providing distributed dynamic functionality in an electronic environment comprising:
   a plurality of platforms, the platforms suitable for providing a logic function, the platforms including embedded programmable logic and MRAM memory, the logic and MRAM memory communicatively coupled via an interconnect,
   wherein the interconnect is an isochronous fabric interconnect.

5. A system for providing distributed dynamic functionality in an electronic environment comprising:
   a plurality of platforms, the platforms suitable for providing a logic function, the platforms including embedded programmable logic and MRAM memory, the logic and MRAM memory communicatively coupled via an interconnect,
   where the interconnect is realized within a switching fabric which permits adaptive interconnect and access paths to be defined on the fly.

6. A system for providing distributed dynamic functionality in an electronic environment comprising:
   a plurality of platforms, the platforms suitable for providing a logic function, the platforms including embedded programmable logic and MRAM memory, the logic and MRAM memory communicatively coupled via an interconnect; and
   a map expressing logic function of the plurality of platforms,
   wherein instruction set extensions are utilized through the use of the map to coordinate discrete instruction set extensions on a cycle-by-cycle basis and execution is synchronized across the plurality of platforms utilizing an isochronous fabric interconnect so that the instruction set extensions are utilized by corresponding platforms at a corresponding cycle.

7. The system as described in claim 6, wherein logic functions are targeted at the platforms indicated by the map as having corresponding functionality at a corresponding point in time.

* * * * *